United States Patent [19]

Maringer et al.

[11] 4,161,962

[45] Jul. 24, 1979

[54] CIRCUIT FOR DETERMINING THE RESPONSE CURRENT OF MAGNETIC VALVES

[75] Inventors: Albert Maringer; Michael Labinsky, both of Karlsruhe, Fed. Rep. of Germany

[73] Assignee: Siemens Aktiengesellschaft, Munich, Fed. Rep. of Germany

[21] Appl. No.: 827,025

[22] Filed: Aug. 23, 1977

[30] Foreign Application Priority Data

Sep. 10, 1976 [DE] Fed. Rep. of Germany ....... 2640900

[51] Int. Cl.² ...................... F16K 31/06; G01R 33/00
[52] U.S. Cl. ................................. 137/557; 324/28 R; 324/59; 123/32 EF; 251/129
[58] Field of Search ............... 123/32 EF; 324/28 SE, 324/28 CB, 59, 28 R; 251/129

[56] References Cited

U.S. PATENT DOCUMENTS 2,962,609  11/1960  MacDonald ........................ 324/28 R
3,548,301  12/1970  Zutkis ................................ 324/28 R Primary Examiner—Arnold Rosenthal
Attorney, Agent, or Firm—Kenyon & Kenyon

[57] ABSTRACT

A circuit for determining the minimum operating current of magnetic valves, wherein a current source which delivers an impressed current rising in ramp fashion supplies the field coil of the magnetic valve, with a differentiator for the voltage at the field coil connected parallel to the field coil, the output of the differentiator being fed to a control input of an electronic switching unit, the output of the switching unit in control connection with a program generator for the current source in such a manner that a sudden rise of the output voltage of the differentiating member stops the program generator and the program value, which was reached when the current rise was stopped and determines the minimum operating current, is stored in a memory connected to the program generator.

10 Claims, 3 Drawing Figures a
CIRCUIT FOR DETERMINING THE RESPONSE CURRENT OF MAGNETIC VALVES

BACKGROUND OF THE INVENTION

This invention relates to magnetic valves in general and more particularly to an improved circuit for determining the minimum operating current (response current) of magnetic valves.

The response current of relays is measured by applying a staircase voltage to the field coil of the relay. When the relay finally responds, the further advance of the staircase supply voltage is interrupted by a contact of the relay, and the value of the response current can be read on a measuring device. The response indication thus is accomplished by the relay to be measured itself.

In principle, the response current of magnetic valves could also be determined in this manner. Because of the delay in the response indication caused by the mechanism of the relay, and the advancing of the supply voltage in staircase steps, this manner of determining the response current yields values which are too inaccurate, particularly if the response current of the magnetic valve is also to be used for indirectly determining the pressure in the fluid line which is shut off by the magnetic valve. This problem comes up frequently in the diagnosis of motor vehicles, having engines which operate with fuel injection and which also contain hydraulic systems controlled by magnetic valves. By determining the fluid pressure indirectly via the response current of the magnetic valves, expensive pressure pickups can be saved.

SUMMARY OF THE INVENTION

It is an object of the present invention to permit as exact a measurement as possible of the response current of magnetic valves. A circuit which is suited for this purpose, according to the present invention, includes a current source for supplying the field coil of the magnetic valve. The current source delivers an impressed current in the form of a rising ramp. Parallel to the field coil a differentiator for the voltage at the field coil is connected, the output of which is fed to a control input of an electronic switching unit. The output of the switching unit is in control connection with a program generator for the current source in such a manner that a sudden rise of the output voltage of the differentiator stops the program generator. The program value which was reached when the current rise was stopped and which determines the response current, is stored in a memory connected to the program generator.

The inductance change of the field coil which occurs when the magnetic valve responds, generates a voltage pulse in the field coil, due to the impressed current, which is used to interrupt the rising current ramp, storing its end value reached. In this chain of action there is no mechanical element with appreciable delay, so that the response current can be determined with great accuracy. Its change in a given magnetic valve permits very accurate conclusions concerning pressure changes in the fluid line shut off by the magnetic valve, regardless of whether the magnetic valve in quesiton is opened with or against the pressure in the line shut off by it.

It is advantageous to use a voltage to current converter, the control voltage of which is fed in via the program generator as a ramp voltage, as the current source.

The program transmitter may either be an analog integrator or a digital memory in the manner of a ROM, in which the rising control voltage is stored in digital form. In this case, bit outputs of the digital memory are connected to corresponding inputs of a digital to analog converter, which controls the voltage side of the current source.

The circuit can, of course, also be used to determine the response current of relays or other electromechanical components which are operated via field coils.

DETAILED DESCRIPTION OF THE INVENTION

Figure 1:
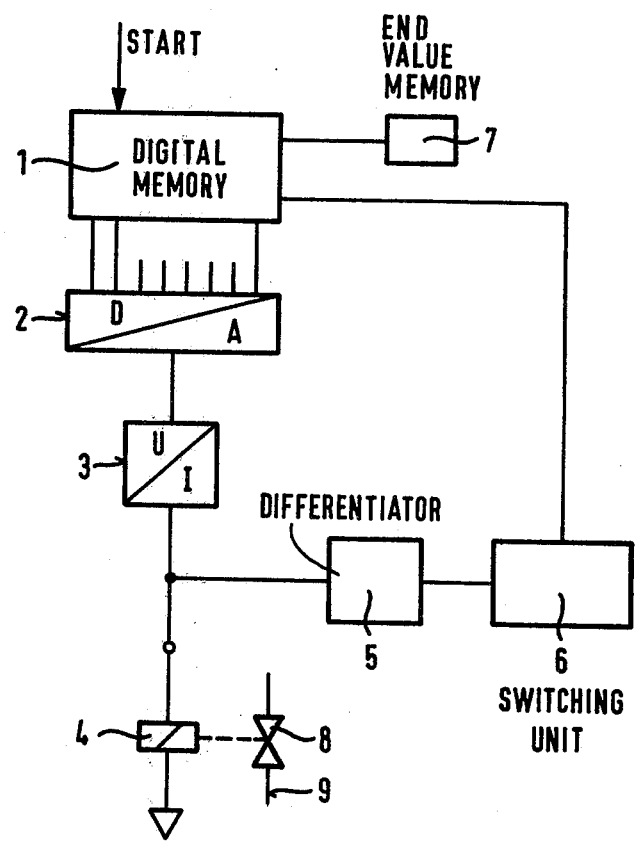
FIG. 1 is a block diagram of an embodiment of the present invention with digital program control.

In FIG. 1, a function which rises as a ramp is stored in individual digital values in a digital memory 1, which can also be considered a function generator. Bit outputs of the digital memory 1 are connected to corresponding inputs of a digital to analog converter 2. The analog output of the converter 2 is fed to the voltage input of a voltage to current converter 3, which serves a current source. The field winding 4 of a magnetic valve 8 is connected between the current output of the converter 3 and ground. It shuts off a fluid line 9. The input of a differentiator 5 is also connected to the point where the field winding 4 is connected to the current output of the voltage to current converter 3. Its output is connected to the input of a switching unit 6. A switching output of the unit 6 is connected to a stop input of the digital memory 1. An end value memory 7 which, upon the stop signal of the switching unit 6, stores the program value which was read out last from the digital memory 1 is also connected to the memory 1.

The digital memory, in addition to including a memory device such as an ROM will also include means for accessing sequential memory locations. Typically this can include a clock having an output coupled through a gate to the input of a counter with the counter outputs coupled to the memory address inputs. The gate can be enabled by a flipflop which is set by a start signal and reset by the stop signal from switching unit 6. The start signal can also be used to reset the counter and the end value memory 7 which may simply be a storage register. Transfer of new data to the storage register can be accomplished by enabling gates coupling the output of the memory 1 to the register with the output of the flipflop which is present when it is reset by the stop signal.

The start of the measurement is triggered by a read signal given to the start input of the digital memory 1. Thereupon, successive function values of the ramp function in the digital memory 1 are read out sequentially from the latter into the digital to analog converter 2, the analog output of which transmits a control voltage rising as a ramp to the voltage input of the voltage to current converter 3 which is used as a current source. The current output of the voltage to current converter 3 has very high resistance and impresses on the field coil 4 of the magnetic valve 8 a rising ramp current. The inductance of the field coil, which is suddenly increased when the magnetic valve 8 responds, due to the impressed current, causes a steep voltage pulse which is taken off via the differentiating member 5 and stops the reading out of further function values from the digital memory 1 via the electronic switching unit 6. The function value last read out, which corresponds to the response value of the magnetic valve 8, is then stored in the end value memory 7 and can be read out from it or processed further.

Figure 2:
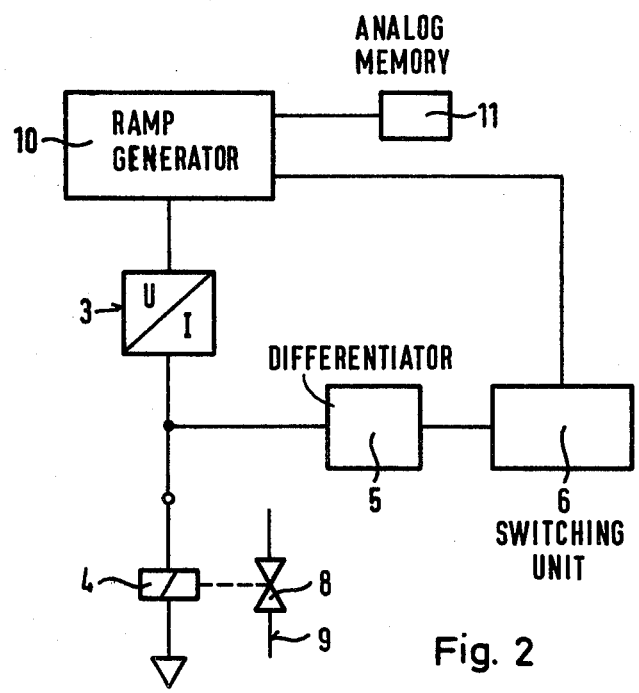
FIG. 2 is a block diagram of an embodiment of the present invention with an analog program generator.

In FIG. 2, which shows an embodiment of the present invention with an analog generator, circuit components which are the same as in the embodiment according to FIG. 1, are given the same reference numbers. The difference between the embodiment of FIG. 2 and that of FIG. 1 is that the digital memory 1 and the digital to analog converter 2 are replaced by a ramp generator 10. A Miller integrator, for instance, can be used as the ramp generator. It is advantageously equipped with a device for setting the rise time. The operation of the circuit according to FIG. 2 corresponds in principle to the operation of the circuit as per FIG. 1. Instead of the digital end value memory 7, an analog end value memory 11, e.g., a sample and hold circuit, which stores the end value of the ramp generator reached when the magnetic valve responds, is provided in the embodiment according to FIG. 2.

Figure 3:
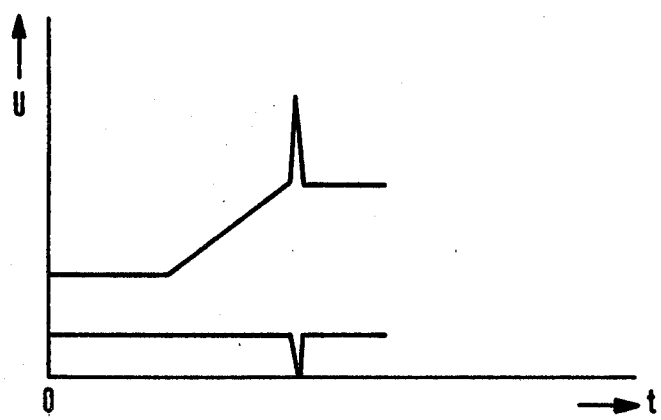
FIG. 3 is a diagram which shows the voltage which can be taken off at the field coil on a first line and shows the output signal of the switching unit on a second line.

In FIG. 3, a voltage vs time diagram is shown, in which are depicted on two lines the voltage which can be taken off at the field coil 4 of the magnetic valve 8 and the output signal of the switching unit 6. It can be seen that, at the end of a linearly rising voltage ramp, a voltage pulse appears which indicates the response of the magnetic valve 8. This voltage pulse becomes visible in the second line as a switching pulse of the output signal of the switching unit.

The differentiator 5 may simply be a capacitor and the switching unit 6 an amplifier biased to respond to the output of the differentiator.

What is claimed is:

1. A circuit for determining the response current of magnetic valves comprising:
 a. a current source for delivering an impressed current rising as a ramp to a field coil of the magnetic valve;
 b. a differentiator coupled parallel to the field coil for the differentiating the voltage at the field coil;
 c. an electronic switching unit having as a control input the output of said differentiator;
 d. a program generator in control connection with the current source in such a manner that a sudden rise in the output voltage of the differentiator stops the program generator; and
 e. means for storing the program value, which is reached when the current rise is stopped and which determines the response current, coupled to the program generator.

2. A circuit according to claim 1, wherein said current source comprises a voltage to current converter.

3. A circuit according to claim 2, wherein said program generator comprises a digital memory and an analog to digital converter the bit outputs of said memory connected to corresponding inputs of said digital to analog converter, said converter coupled to control said current source.

4. A circuit according to claim 2, wherein said program generator comprises an analog integrator and said memory is an analog value memory.

5. A circuit according to claim 4 in combination with a fluid line which is shut off by a magnetic valve whereby said circuit will serve to indirectly measure the pressure in said line.

6. A circuit according to claim 3 in combination with a fluid line which is shut off by a magnetic valve whereby said circuit will serve to indirectly measure the pressure in said line.

7. A circuit according to claim 1, wherein said program generator comprise a digital memory and an analog to digital converter the bit outputs of said memory connected to corresponding inputs of said digital to analog converter, said converter coupled to control said current source.

8. A circuit according to claim 1, wherein said program generator comprises an analog integrator and said memory is an analog value memory.

9. A circuit according to claim 2 in combaination with a fluid line which is shut off by a magnetic valve whereby said circuit will serve to indirectly measure the pressure in said line.

10. A circuit according to claim 1 in combination with a fluid line which is shut off by a magnetic valve whereby said circuit will serve to indirectly measure the pressure in said line.

* * * * *